(12) United States Patent
Ma et al.

(10) Patent No.: US 6,878,418 B2
(45) Date of Patent: Apr. 12, 2005

(54) METHOD FOR MAKING ZONE-BONDED LUBRICANT LAYER FOR MAGNETIC HARD DISCS

(75) Inventors: Xiaoding Ma, Fremont, CA (US); Michael Joseph Stirniman, Fremont, CA (US); Jing Gui, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 88 days.

(21) Appl. No.: 10/402,070

(22) Filed: Mar. 27, 2003

(65) Prior Publication Data

US 2003/0185986 A1 Oct. 2, 2003

Related U.S. Application Data (60) Provisional application No. 60/368,681, filed on Mar. 29, 2002.

(51) Int. Cl.[7] .................. C23C 16/04; C23C 16/02; C23C 16/48; C08F 2/46; C08J 7/18
(52) U.S. Cl. .................. 427/534; 427/491; 427/490; 427/525; 427/526; 427/533; 427/536; 427/535; 427/577; 427/248.1; 427/430.1
(58) Field of Search ......................... 427/523, 525, 427/526, 530, 533, 534, 535, 536, 569, 577, 130, 131, 248.1, 249.1, 490, 497, 509, 491, 430.1, 443

(56) References Cited

U.S. PATENT DOCUMENTS

| | | | | |
|---|---|---|---|---|
| 5,279,866 A | * | 1/1994 | Bourget et al. | 427/575 |
| 5,286,534 A | * | 2/1994 | Kohler et al. | 427/577 |
| 5,650,900 A | | 7/1997 | Wei et al. | |
| 5,750,210 A | * | 5/1998 | Schmidt et al. | 427/577 |
| 5,820,945 A | | 10/1998 | Wei et al. | |
| 5,858,182 A | * | 1/1999 | Horng et al. | 204/192.16 |
| 5,888,593 A | * | 3/1999 | Petrmichl et al. | 427/563 |
| 5,900,288 A | * | 5/1999 | Kuhman et al. | 427/534 |
| 5,922,415 A | * | 7/1999 | Dearnaley et al. | 427/490 |
| 6,086,796 A | * | 7/2000 | Brown et al. | 264/1.33 |
| 6,099,896 A | * | 8/2000 | Stirniman | 427/131 |
| 6,214,410 B1 | * | 4/2001 | Stirniman et al. | 427/131 |
| 6,392,244 B1 | * | 5/2002 | Grannen et al. | 250/492.21 |
| 6,548,140 B1 | * | 4/2003 | Gui et al. | 428/65.4 |
| 6,572,934 B2 | * | 6/2003 | Watanabe et al. | 427/534 |
| 6,602,570 B1 | | 8/2003 | Ma et al. | |
| 6,627,302 B1 | * | 9/2003 | Tang et al. | 428/212 |
| 6,656,333 B2 | * | 12/2003 | Lee et al. | 204/192.16 |
| 6,656,614 B1 | * | 12/2003 | Li et al. | 428/694 ST |
| 6,673,429 B1 | * | 1/2004 | Ma et al. | 428/216 |
| 6,753,043 B1 | * | 6/2004 | Kuo et al. | 427/526 |
| 6,767,592 B2 | * | 7/2004 | Gui et al. | 427/553 |
| 6,800,349 B2 | * | 10/2004 | Ma et al. | 428/65.4 |
| 2001/0002284 A1 | * | 5/2001 | Kohler et al. | 427/488 |
| 2003/0165635 A1 | * | 9/2003 | Kwok et al. | 427/569 |

* cited by examiner

*Primary Examiner*—Marianne Padgett
(74) *Attorney, Agent, or Firm*—Raghunath S. Minisandram; Jesus Del Castillo (57) ABSTRACT

A system and method for improving the durability and reliability of recording media used in hard drives is disclosed. A protective overcoat made by depositing a diamond like carbon (DLC) layer over a magnetic layer and then depleting a portion of the DLC protective layer of hydrogen before it is coated with a Perfluoropolyethers (PFPE) using an in-situ vapor lubrication technique. The portion of the DLC layer which is depleted can be data zone of the media so that the lubricant-bonding ratio is higher for the landing zone than it is for the data zone.

19 Claims, 9 Drawing Sheets

METHOD FOR MAKING ZONE-BONDED LUBRICANT LAYER FOR MAGNETIC HARD DISCS

This application claims priority from U.S. provisional application Ser. No. 60/368,681, filed on Mar. 29, 2002.

BACKGROUND OF THE INVENTION

1. Field of the Invention

The present invention relates to magnetic discs for use in computer disc drives, and, more particularly, to application of the lubricant layer over the magnetic disc.

2. Description of the Related Art

Computer disc drives commonly use components made out of thin films to store information. Both the read-write element and the magnetic storage media of disc drives are typically made from thin films.

Figure 1A:
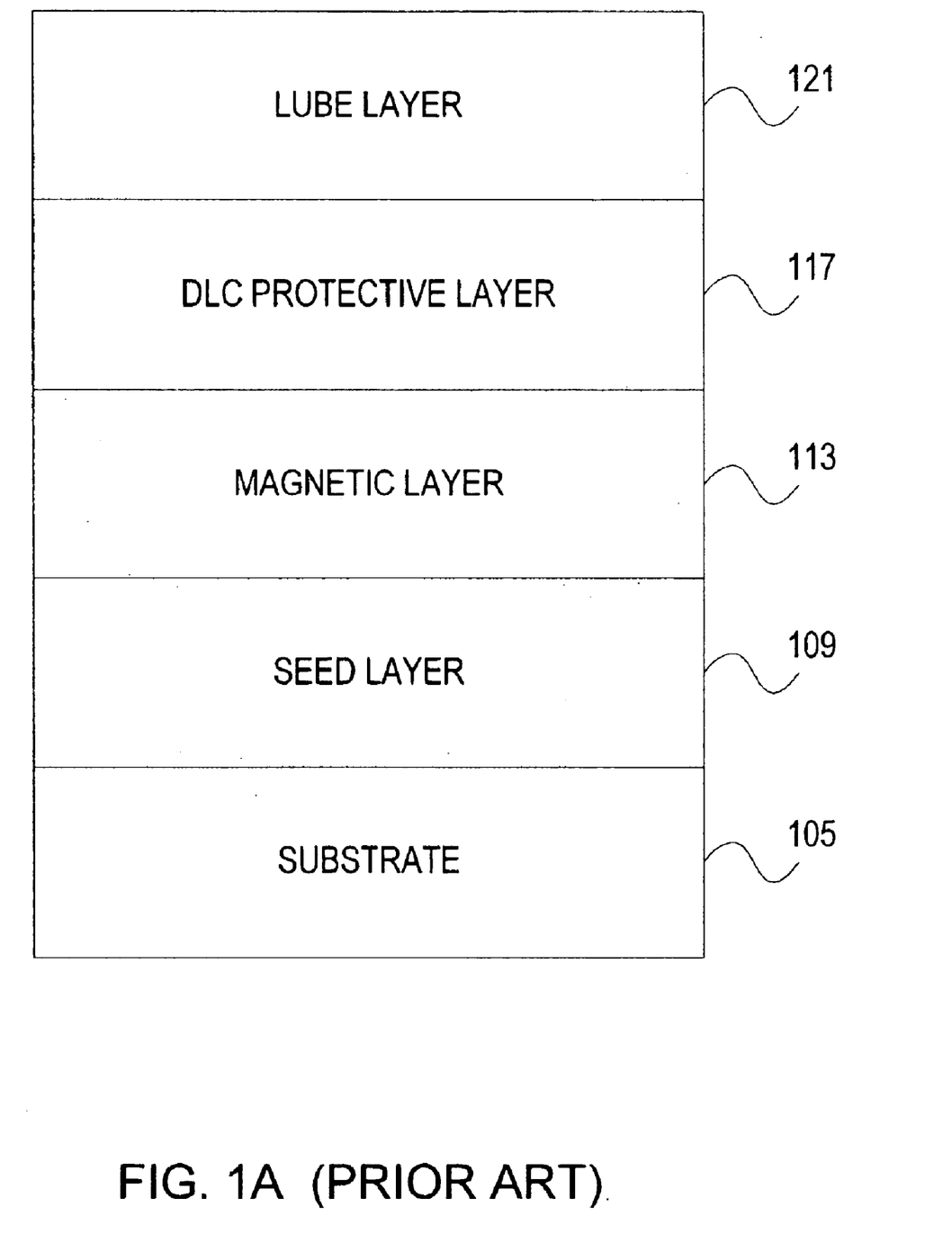
FIG. 1A is a block diagram showing a prior art conventional magnetic media structure.

FIG. 1A is an illustration showing the layers of a conventional magnetic media structure including a substrate 105, a seed layer 109, a magnetic layer 113, a diamond like carbon (DLC) protective layer 117, and a lube layer 121. The initial layer of the media structure is the substrate 105, which is typically made of nickel-phosphorous plated aluminum or glass that has been textured. The seed layer 109, typically made of chromium, is a thin film that is deposited onto the substrate 105 creating an interface of intermixed substrate 105 layer molecules and seed layer 109 molecules between the two. The magnetic layer 113, typically made of a magnetic alloy containing cobalt (Co), platinum (Pt) and chromium (Cr), is a thin film deposited on top of the seed layer 109 creating a second interface of intermixed seed layer 109 molecules and magnetic layer 113 molecules between the two. The DLC protective layer 117, typically made of carbon and hydrogen, is a thin film that is deposited on top of the magnetic layer 113 creating a third interface of intermixed magnetic layer 113 molecules and DLC protective layer 117 molecules between the two. Finally the lube layer 121, which is a lubricant typically made of a polymer containing carbon (C) and fluorine (F) and oxygen (O), is deposited on top of the DLC protective layer 117 creating a fourth interface of intermixed DLC protective layer 117 molecules and lube layer 121 molecules.

The durability and reliability of recording media is achieved primarily by the application of the DLC protective layer 117 and the lube layer 121. The combination of the DLC protective layer 117 and lube layer 121 is referred to as a protective overcoat. The DLC protective layer 117 is typically an amorphous film called diamond like carbon (DLC), which contains carbon and hydrogen and exhibits properties between those of graphite and diamond. Thin layers of DLC are deposited on disks using conventional thin film deposition techniques such as ion beam deposition (IBD), plasma enhanced chemical vapor deposition (PECVD), magnetron sputtering, radio frequency sputtering or chemical vapor deposition (CVD). During the deposition process, adjusting sputtering gas mixtures of argon and hydrogen varies the concentrations of hydrogen found in the DLC. Since typical thicknesses of DLC protective layer 117, are less than 100 Angstroms, lube layer 121 is deposited on top of the DLC protective layer 117, for added protection, lubrication and enhanced disk drive reliability. Lube layer 121 further reduces wear of the disc due to contact with the magnetic head assembly.

A typical lubricant used in lube layer 121 is Perfluoropolyethers (PFPEs), which are long chain polymers composed of repeat units of small perfluorinated aliphatic oxides such as perfluoroethylene oxide or perfluoropropylene oxide. As is well known in the art, PFPEs are used as lubricants because they provide excellent lubricity, wide liquid-phase temperature range, low vapor pressure, small temperature dependency of viscosity, high thermal stability, and low chemical reactivity. PFPEs also exhibit low surface tension, resistance to oxidation at high temperature, low toxicity, and moderately high solubility for oxygen. Several different PFPE polymers are available commercially, such as Fomblin Z (random copolymer of $CF_2CF_2O$ and $CF_2O$ units) and Y (random copolymer of $CF(CF_3)CF_2O$ and $CF_2O$) including Z-DOL and AM 2001 from Montedison, Demnum (a homopolymer of $CF_2CF_2CF_2O$) from Daikin, and Krytox (homopolymer of $CF(CF_3)CF_2O$).

Lube layer 121 is typically applied evenly over the disc, as a thin film, by dipping the discs in a bath containing mixture of a few percent of PFPE in a solvent and gradually draining the mixture from the bath at a controlled rate. The solvent remaining on the disc evaporates and leaves behind a layer of lubricant less than 100 Angstroms. Recent advances have enabled the application of PFPE using an in-situ vapor deposition process that includes heating the PFPE with a heater in a vacuum lube process chamber. In this system, evaporation occurs in vacuum onto freshly deposited DLC protective layer 117 that has not been exposed to atmosphere, creating a thin uniform coating of PFPE lube layer 121.

Since it is known in the art that recording media with higher lubricant bonded ratio has better corrosion protection and that an in-situ vapor lubrication process enhances the bonding between lubricants and amorphous carbon, in-situ vapor lubrication has been used to lubricate amorphous carbon layers. In-situ vapor lubrication of recording media is the lubrication of the recording media immediately after the DLC protective layer 117 has been deposited over the magnetic layer 113 without exposing it to atmosphere.

Figure 1B:
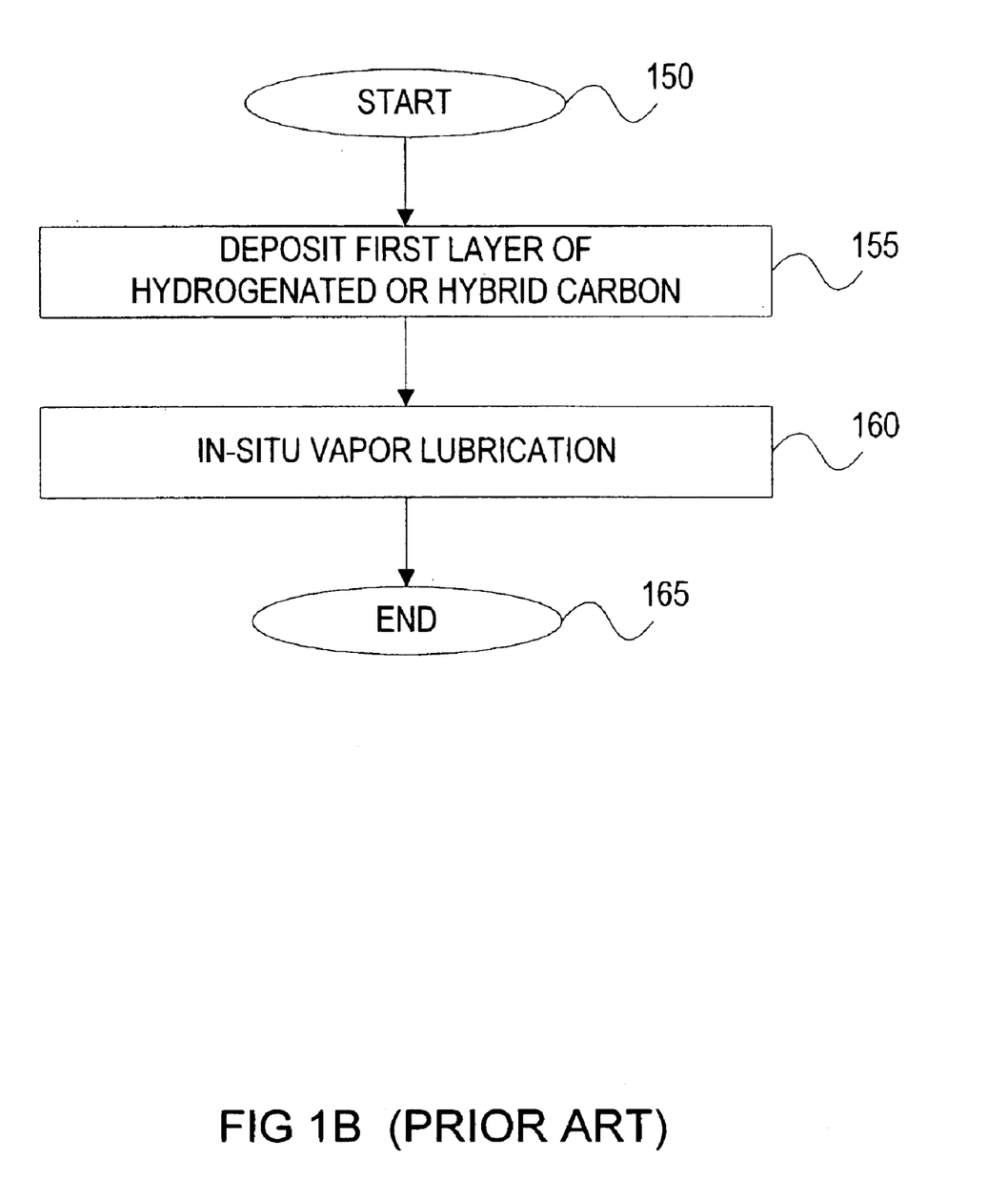
FIG. 1B is a flowchart illustrating the prior art method of using in-situ vapor lubrication on a carbon layer.

FIG. 1B is a flow chart showing the typical steps used in an in-situ vapor lubrication process that deposits PFPE lubricant over a carbon layer. The process begins with step 150 by transferring a partially complete media with substrate 105, seed layer 109, and magnetic layer 113 into a vacuum chamber. The transferring process typically involves moving a disk, after depositing a magnetic layer on it, into a carbon deposition chamber without taking it out of vacuum. In step 155 an amorphous carbon layer is deposited over the partially complete media. Typically the amorphous carbon layer is diamond like carbon (DLC) that has been deposited by conventional sputter deposition techniques. Next in step 160, the amorphous carbon is coated with a lube layer 121 of PFPE using an in-situ vapor lubrication process. Finally, in step 165 the lubed magnetic media is transferred to the next manufacturing operation.

Figure 1C:
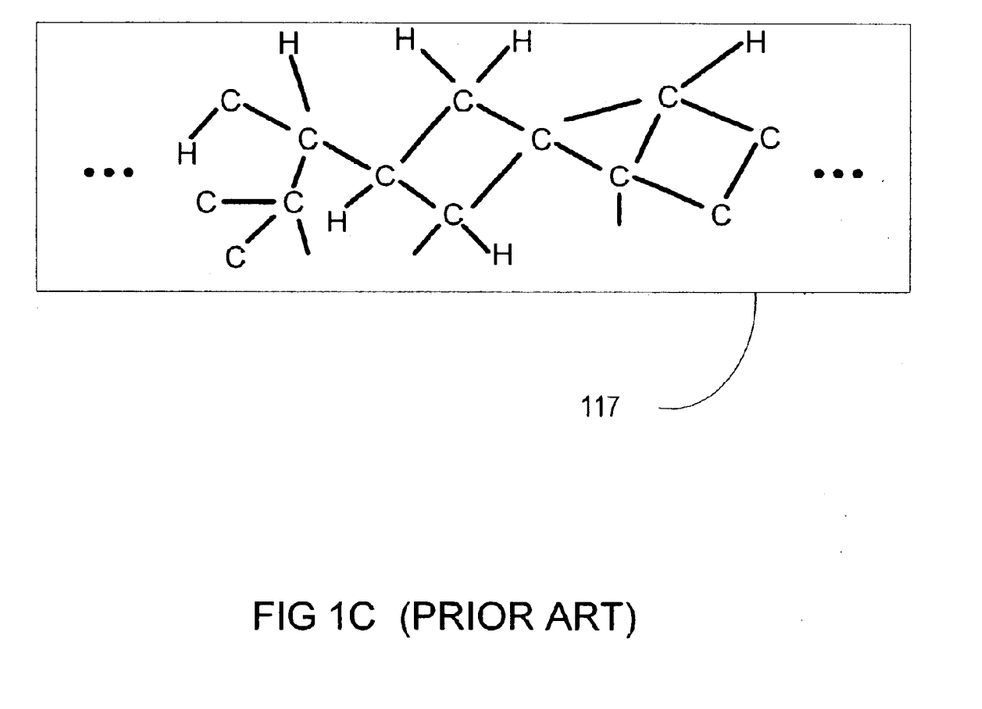
FIG. 1C is an illustration of a prior art DLC protective layer ready to be lubed.

The same technology, however, works less effectively with a DLC protective layer 117. When a DLC protective layer 117 is applied over the magnetic layer 115, unpaired carbon electrons pair with hydrogen electrons and dangling carbon bonds are tied up, as illustrated in FIG. 1C. FIG. 1C is an illustration showing the carbon bonds that are not tied up by other carbon atoms being tied up at the surface with hydrogen bonds. The termination of the carbon bonds on the surface by hydrogen effectively reduces the reactive sites. As a result, the bonding sites for lubricant molecules are reduced and therefore the lubricant bonded ratio decreases. This effect is particularly strong when lubricant is deposited in-situ after depositing the DLC protective layer 117, as manifested by the poor adhesion of lube layer 121 to the DLC protective layer 117. Because of this effect, IBD or PECVD processes, which produce DLC protective layer 117, and in-situ vapor lubrication processes, which enhances bonding, have not been combined to achieve the maximum performance.

The conflicting tribological requirements in the data zone (DZ) of a magnetic disc where information is stored and the landing zone (LZ) where a head takes-off and lands often require different lube designs in different zones. For example, bonded lube is more desirable in the DZ where flyability corrosion protection are the primary concerns, whereas sufficient mobile lube is essential in the LZ where wear durability is of greater importance. While the benefit of zone lubrication to satisfy both requirements has been recognized in the art, the known methods generally focus on post-lubrication treatments by either partial removal or by zone radiation. These additional steps could add considerable complexity to the disc manufacturing process. Particularly, in the case of in-situ vapor lubrication process, these post-lubrication treatments defeat the main benefit of the in-situ vapor lube process, i.e., simplicity and low cost.

Therefore what is needed is a system and method which overcomes these problems and makes it possible to apply a lubricant to a carbon overcoat using an in-situ vapor lubrication process that results in a reliable final overcoat with desirable properties. Desirable properties include a resulting lubricant that is bonded to the carbon overcoat more strongly at the data zone than at the landing zone.

SUMMARY OF THE INVENTION

This limitation is overcome by depleting hydrogen from the diamond like carbon layer at the data zone while leaving the landing zone alone. Depleting hydrogen from the diamond like carbon layer prior to the application of the lube layer enhances the bond between the diamond like carbon protective layer and the lube layer. Therefore depleting hydrogen from the diamond like carbon layer at the data zone while leaving the landing zone alone enhances the bond between the diamond like carbon layer and the lube at the data zone without effecting the existing bond between the diamond like carbon layer and lubricant at the landing zone.

Depletion of hydrogen in the data zone activates the surface of the DLC protective layer 117, in the data zone, by creating unpaired electrons in the DLC that are ready to react. The unpaired electrons create a strong bond between the DLC protective layer 117 and the lube layer 121.

The data zone of the DLC protective layer 117 is depleted of hydrogen by bombarding the data zone with argon ions. The hydrogen atoms are ejected from the surface of the data zone DLC protective layer 117 when the accelerated argon ions collide with them.

These and various other features as well as advantages which characterize the present invention will be apparent upon reading of the following detailed description and review of the associated drawings.

BRIEF DESCRIPTION OF THE INVENTION

DETAILED DESCRIPTION OF THE PREFERRED EMBODIMENTS

The invention provides a system and method for protecting magnetic media.

Figure 2:
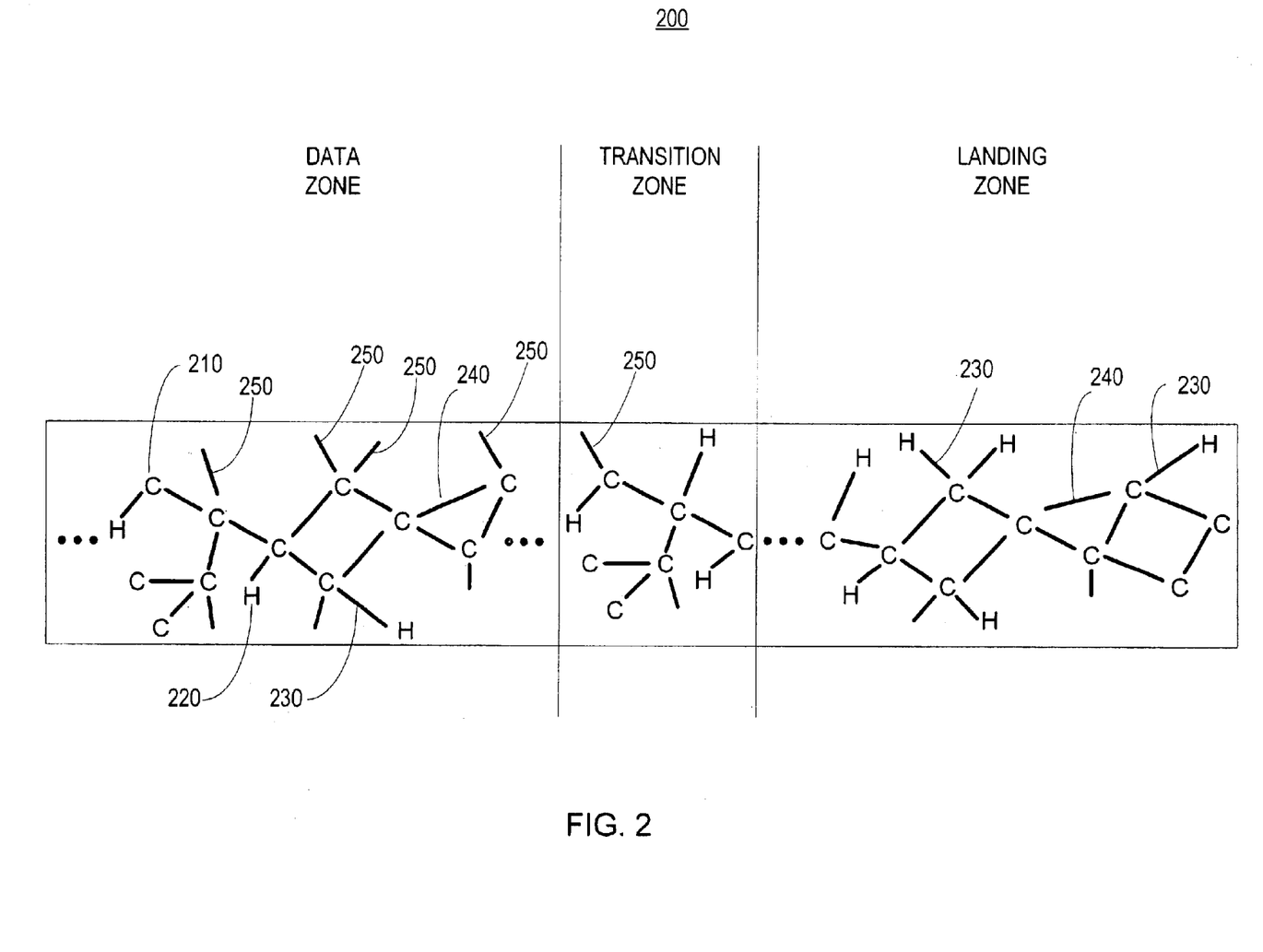
FIG. 2 is an illustration of a DLC protective layer, with the landing zone being Hydrogen Depleted DLC (HDDLC), ready for in-situ vapor lubrication, in accordance with an embodiment of the invention.

FIG. 2 is an illustration of a partially hydrogen depleted DLC (HDDLC) layer 200, with the data zone, landing zone and transition zone clearly demarcated, ready for in-situ vapor lubrication, in accordance with one embodiment of the invention. The data zone, which is shown to be hydrogen depleted, is the portion of the magnetic media from where data is recorded and retrieved. The landing zone, which is shown not to be hydrogen depleted, is the portion of the magnetic media where the head comes to rest when the magnetic media stops spinning. The transition zone, which is shown to be partially hydrogen depleted, is the region of the magnetic media separating the landing zone from the data zone where the data zone transitions into the landing zone. The HDDLC layer 200 includes a plurality of carbon atoms 210, a plurality of hydrogen atoms 220, a plurality of carbon-hydrogen bonds 230, a plurality of carbon-carbon bonds 240 and a plurality of free dangling carbon bonds 250.

The free dangling carbon bonds 250 are created by bombarding a portion, corresponding to the data zone, of the DLC protective layer 117 with charged ions as is furthered described with reference to FIG. 4 below. This bombardment process converts the DLC protective layer 117 into a more reactive HDDLC layer 200 by creating free dangling bonds 250 in the data zone. This increases the bonding between the hydrogen depleted portion of the HDDLC 200 layer and the lubricant that is deposited over the entire HDDLC layer 200 with an in-situ vapor lube process as is described with reference to FIG. 4 below.

Figure 3:
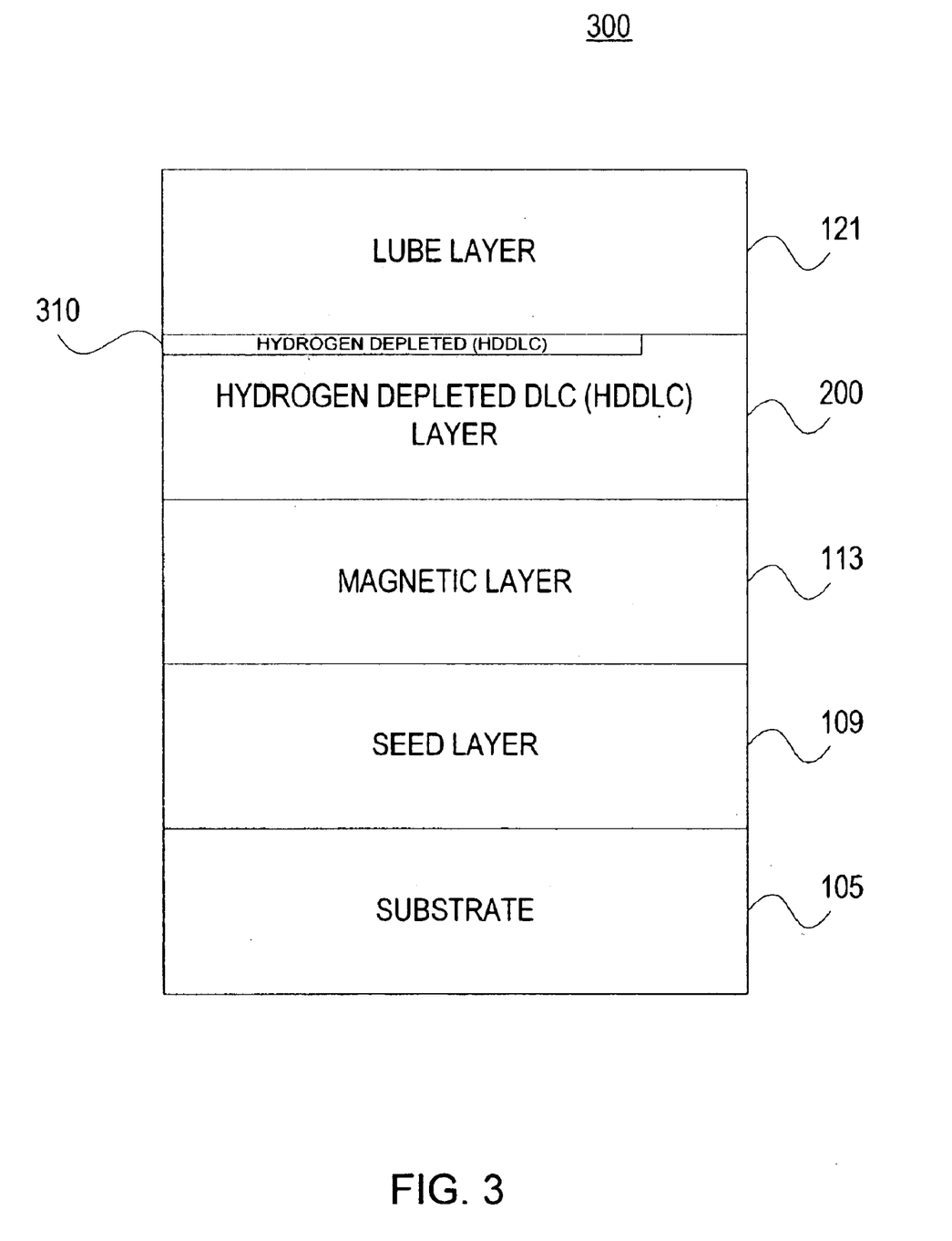
FIG. 3 is a block diagram showing the HDDLC layer 200 in a magnetic media environment.

FIG. 3 is a block diagram showing the HDDLC layer 200 in a magnetic media environment 300 including a substrate 105, a seed layer 109, a magnetic layer 113, a lube layer 121, and a hydrogen depleted region 310. The hydrogen-depleted region 310 is the same region as the data zone region discussed with reference to FIG. 2, above. HDDLC layer 200 protects magnetic media from wear and tear as does DLC protective layer 117 except that it has been modified so that the lube layer 121 adheres to the data zone, which corresponds to the hydrogen depleted region 310, much better than it otherwise would, providing improved protection.

Figure 4:
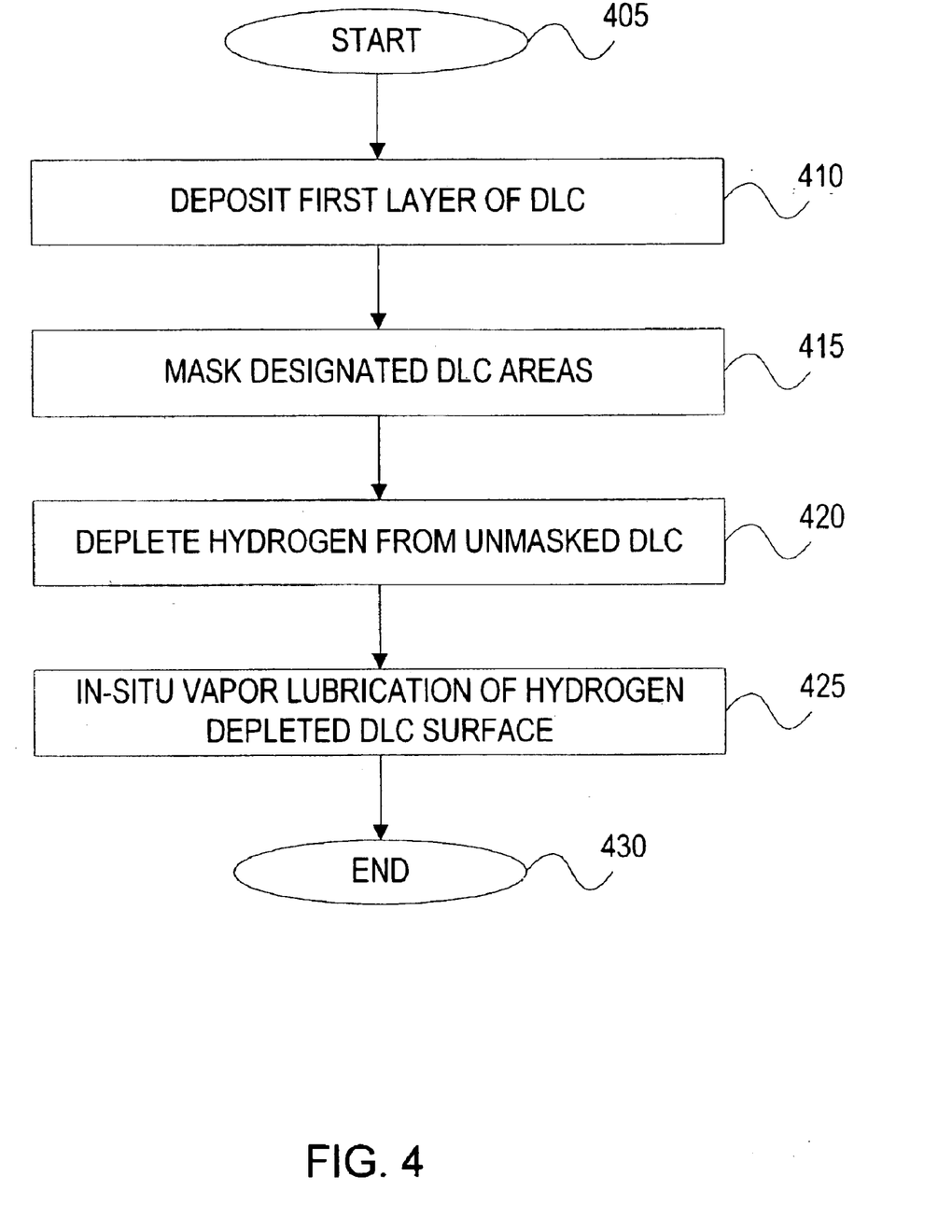
FIG. 4 is a flowchart showing the preferred method of depositing the protective overcoat including the HDDLC layer 200 and the lube layer 121.

FIG. 4 is a flow chart showing the preferred steps used to make a protective overcoat including an HDDLC layer 200 and in-situ lubed layer 121. Protective overcoats typically include a hard layer such as DLC and a lubrication layer. The process begins with step 405 by transferring a partially complete media having substrate 105, seed layer 109, and magnetic layer 113 into a vacuum chamber. The transferring process typically involves moving a disk, after depositing a magnetic layer on it, into a carbon deposition chamber without taking it out of vacuum.

Next in step 410, a DLC protective layer 117 containing carbon and hydrogen is deposited onto the substrate. The deposition process can be done by various thin film deposition techniques including ion beam deposition (IBD), plasma enhanced chemical vapor deposition (PECVD), magnetron sputtering, radio frequency sputtering, or chemical vapor deposition (CVD). In one embodiment, the DLC protective layer 117 is prepared by ion beam deposition using a work gas is $C_2H_2$. The energy per C atom is 90 eV.

Next in step 415, the DLC protective layer 117 is masked so that only a portion of it will be hydrogen depleted. The masking can be done by placing a shield in front of the portions of the DLC protective layer that will not be hydrogen depleted, as is further discussed with reference to FIG. 6 below. The masking is typically done by covering the entire media except in places that are to be hydrogen deleted. For example, placing a shield in front of the magnetic media in all places except the data zone will mask the media so that only the data zone is hydrogen depleted in the subsequent step 420.

In step 420, the masked DLC protective layer 117 is exposed to argon ions ($Ar^+$), from an argon ion plasma, which depletes the unmasked areas of the DLC protective layer 117 of hydrogen atoms. Exposing includes bombarding the DLC protective layer 117 with ions that are accelerated by an electric field as well as allowing atoms, molecules or ions to randomly strike the DLC protective layer 117 in the absence of an electric field. As $Ar^+$ ions bombard the DLC protective layer 117, hydrogen atoms are ejected, reducing the number of hydrogen atoms left on the DLC protective layer 117, creating an HDDLC layer 200. The depletion of hydrogen activates the DLC by making it a reactive carbon. The HDDLC is reactive because carbon atoms that were once bonded to hydrogen atoms now have unpaired electrons available for bonding. Although, the preferred process of removing hydrogen atoms from the DLC layer 117 is the mechanical process of $Ar^+$ ion bombardment, other processes including chemical processes can be used.

Step 420 can be done in the same chamber as that in which the DLC protective layer 117 is deposited or it can be done in a different chamber. If step 420 is performed in a second vacuum chamber then the partially complete media is transferred to a second chamber after the DLC protective layer 117 is deposited. The transferring process is done under vacuum or in an inert environment such as argon. The application of the mask in step 415 can be done in the DLC deposition chamber, the transfer process or the argon bombardment chamber.

In the preferred embodiment, the rate at which hydrogen atoms are removed from the DLC protective layer 117 can be adjusted by changing parameters such as voltages, pressures, flow rates, and temperatures. Voltage controls the electric field acting on the $Ar^+$ ions and consequently the force with which $Ar^+$ ions bombard the DLC protective layer 117. Bombarding occurs when the ions are accelerated towards the DLC protective layer 117, because of the electric field acting on the $Ar^+$ ions, and collide with the DLC protective layer 117. Pressure and flow rates control physical properties of the plasma such as the number of $Ar^+$ ions available to bombard the DLC protective layer 117. Temperature controls the kinetic energy at the surface of the DLC protective layer 117 and consequently the amount of energy that must be imparted to the surface to remove hydrogen atoms.

In the preferred embodiment the plasma is made out of ionized argon. Argon is used in the preferred embodiment because it is inert and readily available. However, other inert gases such as helium (He), neon (Ne), krypton (Kr) or xenon (Xe) can also be used to make up the plasma of charged ions, which bombard the DLC protective layer 117 and remove hydrogen atoms from it. In one embodiment, step 415 is done immediately after deposition where Ar gas is introduced into the process chamber at a flow rate of 10 sccm. The argon is ionized, in the plasma, and accelerated causing the argon ions to bombard the unmasked portions of the DLC films. The duration for this process is 0.5 seconds.

Noble gases are preferred because they are inert and do not chemically react with the DLC protective layer 117. This enables the removal hydrogen atoms from the DLC protective layer 117 by the mechanical process of bombardment. The invention, however, is not limited to only using noble gases because this process can be carried out using non-noble gases which do not chemically react with the DLC protective layer 117. Additionally, this invention is not limited to the removal of hydrogen atoms from the DLC protective layer 117 by mechanical means only. Other methods such as heating the DLC protective layer 117 or chemically reacting another substance with the DLC protective layer 117 can be used to remove hydrogen atoms from the DLC protective layer 117.

Next in step 425, an in-situ vapor deposition technique is used to apply a lubricant onto a partially completed media completing the protective overcoat. In the preferred embodiment PFPE is applied to the partially completed media using an in-situ vapor deposition process that includes heating the lubricant with a heater in a vacuum lube process chamber. In this embodiment, evaporation of PFPE occurs in a vacuum onto HDDLC 200 after the DLC protective layer 117 has been deposited and a portion of its surface depleted of hydrogen 310 by exposing it to ionized argon without exposing the HDDLC 200 to atmosphere. The portion of the DLC surface depleted of hydrogen 310, which corresponds to the data zone in this application, bonds stronger to the lubricant than the portion of the DLC surface that has not been depleted of hydrogen, which in this application corresponds to the landing zone.

Finally in step 430 the lubed magnetic media is transferred to the next manufacturing operation.

Although the preferred steps used to make a protective overcoat are described in reference to a DLC protective layer 117 and lube layer 121, those skilled in the art will recognize that the same steps can be used to deposit any two layers, wherein the bonding between the two layers is improved or where it is desirable to provide areas of differential bond strength. For example, a first layer, which can be metallic, insulating, semi-conducting or semi-metallic, can be deposited as described with reference to step 410. The first layer can then be masked in step 415 so that only the portions of the first layer that are to be activated are uncovered and the remaining portions of the first layer are covered. The first layer is then activated as described with reference to step 420. After the first layer is activated, a second layer, which can also be metallic, insulating, semi-conducting or semi-metallic, can be deposited as described with reference to step 425. The combination of the first layer and second layer can then be transferred to the next manufacturing operation as described in step 425.

Figure 5:
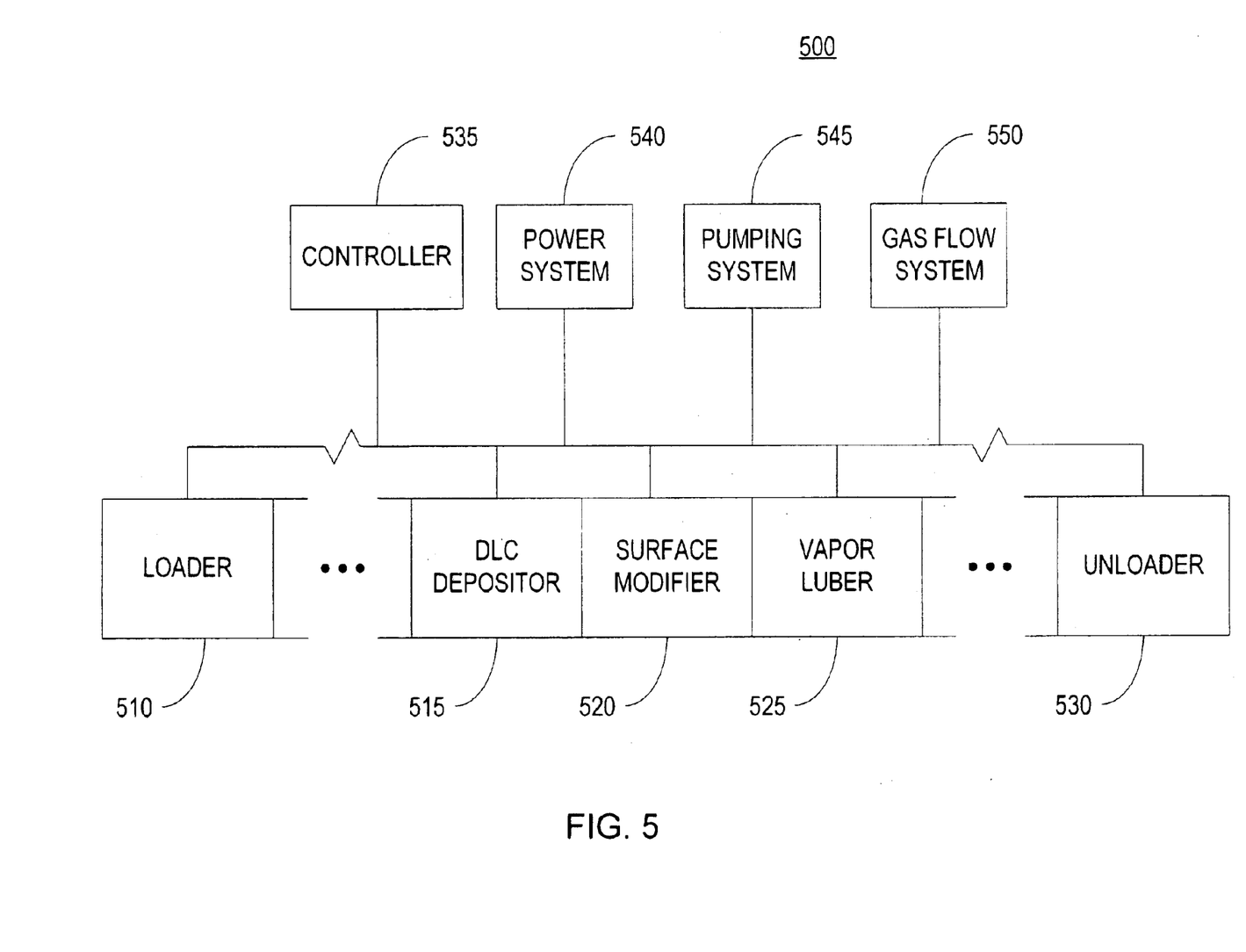
FIG. 5 is a block diagram showing a thin film deposition system used to deposit the magnetic media structure 300.

FIG. 5 represents a multilayer thin film deposition system 500 equipped with an in-situ DLC deposition system, a carbon surface modifying system and a vapor lube system. System 500 preferably includes a loader 510, a DLC depositor 515, a surface modifier 520, a vapor luber 525, an unloader 530, a controller 535, a power system 540, a pumping system 545 and a gas flow system 550.

Loader 510 and unloader 530 represent conventional load locks that allow substrates to be transferred into and out of a vacuum chamber without venting the entire vacuum system. DLC depositor 515 represents a conventional thin film deposition chamber used to deposit the DLC protective layer 117. DLC depositor 515 can use ion beam deposition (IBD), plasma enhanced chemical vapor deposition (PECVD), magnetron sputtering, radio frequency sputtering or chemical vapor deposition (CVD) techniques to deposit the DLC protective layer 117. Surface modifier 520 is used to deplete a portion of the top surface of the DLC protective layer 117 of hydrogen, creating HDDLC layer 200 as is further discussed with reference to FIG. 4 above. Although surface modifier 520 is shown separate from DLC depositor 515 and vapor luber 525, surface modifier 520 can be incorporated into DLC depositor 515 or vapor luber 525.

Vapor luber 525 represents a conventional vapor lubing system used to deposit the lube layer 121 onto the HDDLC layer 200. Controller 535 is the software and hardware that controls the operation of system 500. Power system 540 represents power supplies used to power the system 500 and include power supplies for heaters, conveyers, DC magnetrons, rf sources. Pumping system 545 represents all pumps and valves used to evacuate the vacuum chambers including mechanical pumps, turbo pumps, cryogenic pumps and gate valves. Gas flow system 550 represents the gas delivery equipment such as mass flow controllers, valves, piping and pressure gauges.

Figure 6:
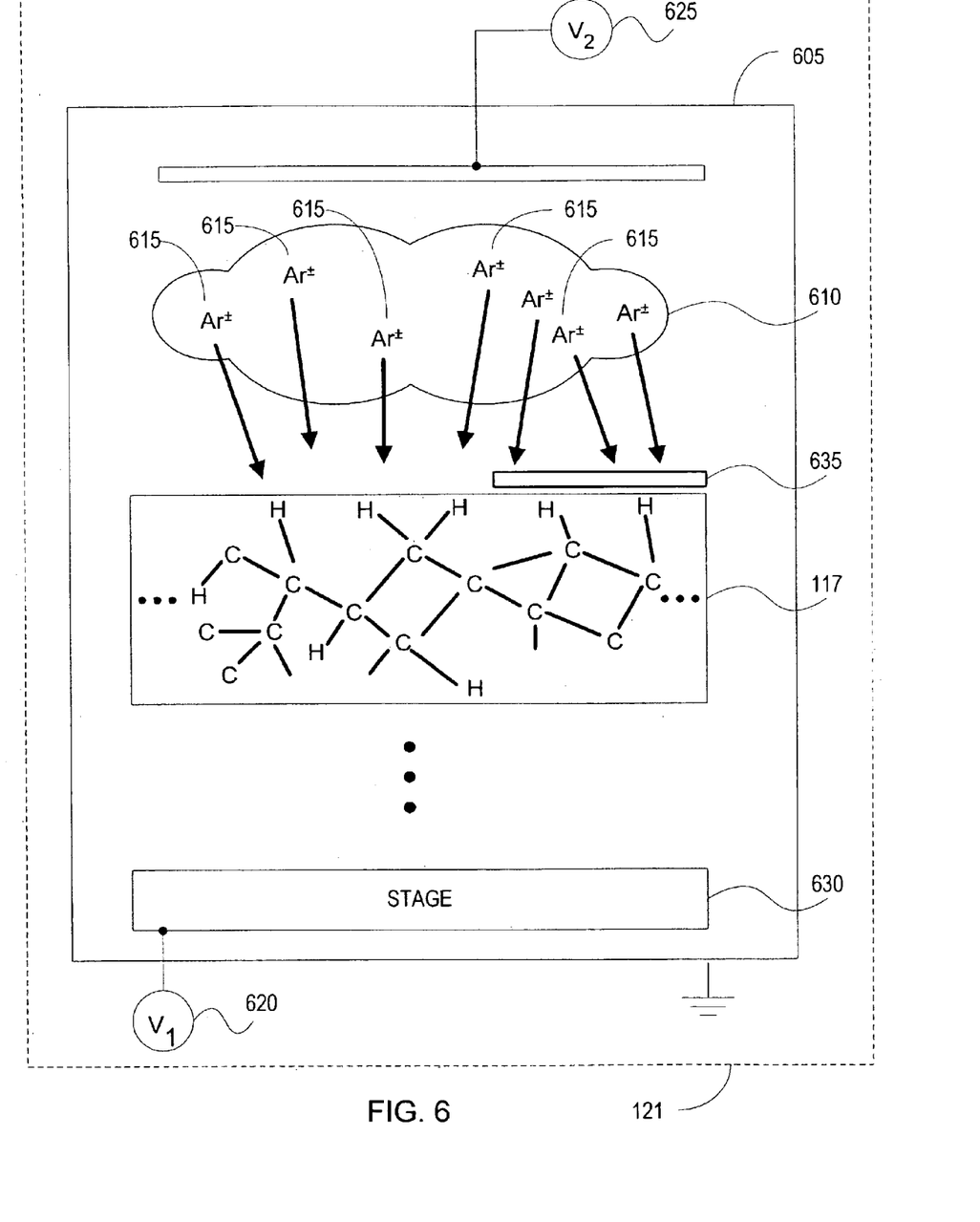
FIG. 6 is an illustration showing details of surface modifier 520 of system 500 of FIG. 5.

FIG. 6 is an illustration showing surface modifier 520 depleting hydrogen atoms from a portion of the top surface of the DLC protective layer 117. In one embodiment, surface modifier 520 includes a vacuum chamber 605, an argon ion plasma 610, argon ions ($Ar^+$) 615, a first voltage $V_1$ 620, a second voltage $V_2$ 625, a stage 630, and a mask 635 depleting hydrogen atoms from a portion of the top surface of the DLC protective layer 117 of a partially completed media.

After depositing the DLC protective layer 117, as discussed with reference to FIG. 1B, a portion of the top surface of the DLC protective layer 117 is exposed to an argon ion plasma 610 consisting of ($Ar^+$) ions 615. In step 415, the partially complete media is moved to a grounded vacuum chamber 605 that is maintained at process pressures ranging from $10^{-3}$ torr to $10^{-2}$ torr. Power supplies such as the Advanced Energy MDX series manufactured by Advanced Energy of Fort Collins, Colo., USA are used to maintain the DLC protective layer 117 and the mask 635 at a first voltage $V_1$ 615 and the argon ion plasma at a second voltage $V_2$ 625. The voltage difference between the plasma and the DLC protective layer 117 and the mask 635 creates an electric field 630 that accelerates the $Ar^+$ ions towards the DLC protective layer 117 and mask 635. The actual trajectory 635 of the argon ions depends on many factors including the initial velocity of the ions and the configuration of the electric field, which is determined by the first voltage 620 and the second voltage 625.

In this embodiment, the purpose of the mask 635 is to block the ions 615 from bombarding the DLC layer 117 at the areas where the mask 635 is located. In other embodiments where the activation of the DLC surface is done by chemical means purpose of the mask 635 is to prevent the activating chemicals from reacting with the surface at positions where the mask is located.

Figure 7:
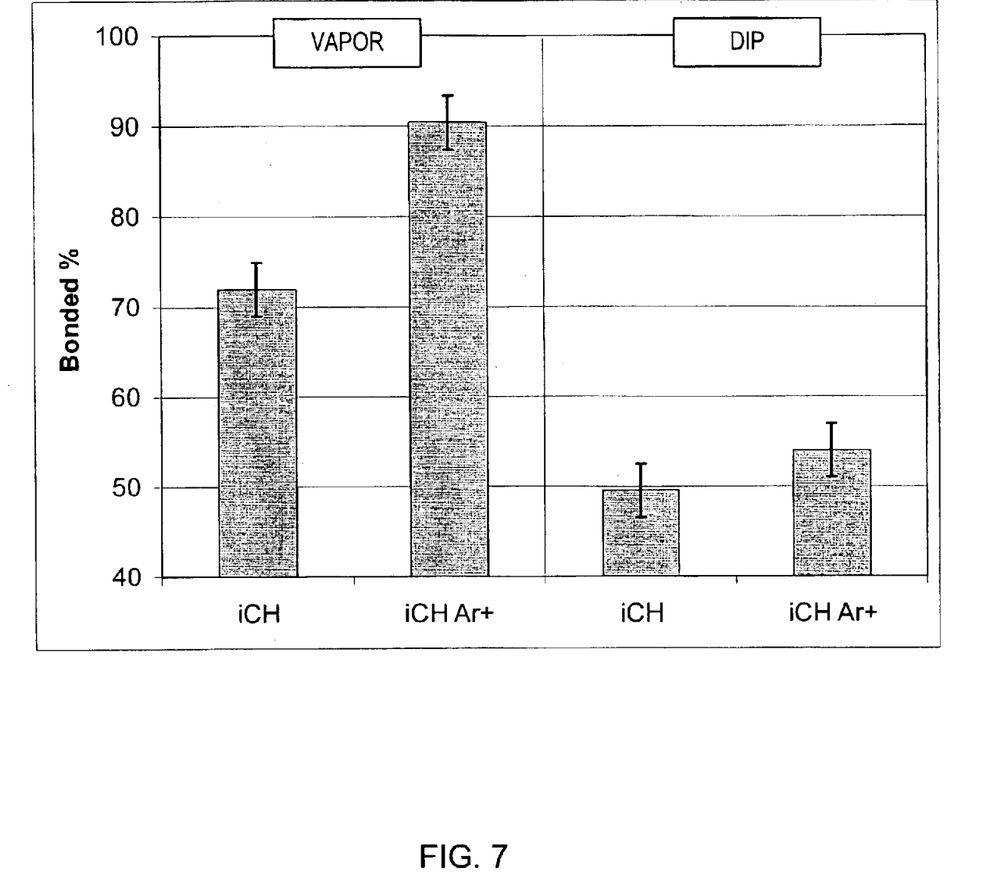
FIG. 7 is a bar graph comparing the percentage of bonded lubricant, which is deposited using vapor deposition and dipping, on hydrogenated carbon that has been activated with argon ions.

FIG. 7 is a graph showing the lubricant-bonding ratio with and without Argon sputtering for both lubricants applied using a vapor lube techniques and a dipping techniques. For lubricant applied using vapor lubrication techniques the bonding ratio increases from about 72% to about 90% by activating the surface with positive argon ions. Similarly, for lubricant applied using dipping techniques the bonding ratio increases from about 49% to about 54% by activating the surface with positive argon ions. In both cases the data suggests that bombarding the surface of the DLC with positive argon ions makes the surface more reactive and increases the lubricant-bonding ratio between the DLC surface and the lubricant.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

We claim:

1. A method of preparing a layer comprising, the steps of:
    depositing a first layer;
    applying a mask over said first layer so that a first portion of said first layer is covered and a second portion of said first layer is not covered;
    activating said second portion of said first layer;
    removing said mask; and
    depositing a lubricant onto said first layer so that a first lubricant-bonding ratio between said first portion of first layer and said lubricant is different than a second lubricant-bonding ratio between said second portion of first layer and said lubricant.

2. The method of claim 1 wherein the step of depositing a first layer includes depositing a hydrogenated carbon layer using ion beam deposition.

3. The method of claim 1 wherein the step of activating the first layer surface is depleting the first layer surface of hydrogen.

4. The method of claim 1 wherein the step of activating the first layer surface is bombarding the first layer surface with charged ions.

5. A method for preparing a protective overcoat with in-situ vapor lubrication, comprising the steps:
    depositing a first layer having carbon and hydrogen onto a medium;
    applying a mask to said medium wherein said mask covers a first portion of said first layer and leaves a second portion of said layer not covered;
    depleting said first portion of said first layer of hydrogen;
    removing said mask from said first layer; and
    depositing a second layer onto said first layer using an in-situ vapor deposition process, said second layer having a lubricant.

6. The method of claim 5 wherein the step of depleting hydrogen includes exposing said first layer with said mask to ionized gas.

7. The method of claim 5 wherein the step of depleting hydrogen includes exposing said first layer with said mask to ionized argon gas.

8. The method of claim 5 wherein the step of depositing a first layer is done using ion beam deposition.

9. The method of claim 5 wherein the step of depositing a first layer is done using plasma enhanced chemical vapor deposition.

10. The method of claim 5 wherein the step of depleting hydrogen includes a chemical process for depleting hydrogen.

11. A method of depositing a lubricant on magnetic media, comprising:

applying a mask to a magnetic media so that a first portion of said magnetic media is covered and a second portion of said magnetic media is uncovered;

bombarding said magnetic media and said mask with ions;

removing the mask from said magnetic media; and applying a lubricant to said magnetic media.

12. The method of claim 11 wherein the step of bombarding said magnetic media includes exposing said first layer with said mask to ionized argon gas.

13. The method of claim 11 wherein the step of applying said lubricant to said magnetic media includes in-situ vapor deposition.

14. The method of claim 11 wherein the step of applying said lubricant to said magnetic media includes dipping the magnetic media in a tank of lubricant.

15. A method of depositing a lubricant on magnetic media, comprising:

applying a mask to a magnetic media so that a first portion of said magnetic media is covered and a second portion of said magnetic media is not covered;

activating said second portion of magnetic media;

removing the mask from said magnetic media; and applying a lubricant to said magnetic media so that a first lubricant-bonding ratio between said first portion of magnetic media and said lubricant is different than a second lubricant-bonding ratio between said second portion of magnetic media and said lubricant.

16. The method of claim 15 wherein the step of applying a lubricant to said magnetic media results in the second lubricant-bonding ratio being greater than said first lubricant bonding ratio.

17. The method of claim 15 wherein the step of activating said second portion of magnetic media is depleting said second portion of magnetic media of hydrogen.

18. The method of claim 15 wherein the step of activating said second portion of magnetic media is bombarding said second portion of magnetic media with charged ions.

19. A method of depositing a lubricant on magnetic media, comprising:

applying a mask to a magnetic media so that a first portion of said magnetic media is covered and a second portion of said magnetic media is not covered;

bombarding said magnetic media and said mask with ions so that said second portion of said magnetic media is depleted of hydrogen;

removing said mask from said magnetic media; and applying a lubricant to said magnetic media so that a first lubricant-bonding ratio between said first portion of magnetic media and said lubricant is different than a second lubricant-bonding ratio between said second portion of magnetic media and said lubricant.

* * * * *